United States Patent [19]
Maker et al.

[11] Patent Number: 5,393,634
[45] Date of Patent: Feb. 28, 1995

[54] CONTINUOUS PHASE AND AMPLITUDE HOLOGRAPHIC ELEMENTS

[75] Inventors: Paul D. Maker, Arcadia; Richard E. Muller, Sunland, both of Calif.

[73] Assignee: The United States of America as represented by the Administrator of the National Aeronautics and Space Administration, Washington, D.C.

[21] Appl. No.: 71,131

[22] Filed: May 27, 1993

[51] Int. Cl.$^6$ .......................... G03C 5/00; G03H 5/00
[52] U.S. Cl. ........................................ 430/1; 430/320; 430/2; 430/942; 430/296; 250/492.22; 250/492.3; 359/565; 359/569
[58] Field of Search ................. 359/565, 569; 250/492.22, 492.3; 430/1, 2, 320, 296, 323, 942

[56] References Cited

U.S. PATENT DOCUMENTS

| | | | |
|---|---|---|---|
| 4,051,271 | 9/1977 | Fujishige | 430/296 |
| 4,360,585 | 11/1982 | Frank et al. | 430/312 |
| 4,772,539 | 9/1988 | Gillespie | 430/296 |
| 4,797,334 | 1/1989 | Glendinning | 430/5 |
| 4,895,790 | 1/1990 | Swanson et al. | 359/569 |
| 5,051,598 | 9/1991 | Ashton et al. | 250/492.3 |
| 5,057,397 | 10/1991 | Miyabe et al. | 430/270 |
| 5,104,772 | 4/1992 | Kobayashi et al. | 430/296 |
| 5,112,724 | 5/1992 | Bradshaw | 430/296 |
| 5,241,185 | 8/1993 | Meiri et al. | 250/492.22 |

FOREIGN PATENT DOCUMENTS

| | | | |
|---|---|---|---|
| 59-61131 | 4/1984 | Japan | 430/296 |
| 59-61133 | 4/1984 | Japan | 250/492.22 |
| 4-212407 | 8/1992 | Japan | 430/296 |

OTHER PUBLICATIONS

Ekberg et al, Appl. Opt. 15 568–569 (May 1990).
Fujita et al, Appl. Opt. 6 613–615 (Dec. 1981).
Fujita et al, Appl. Opt. 7 578–580 (Dec. 1982).
Mihir Parikh, "Corrections to proximity effects in electron beam lithography," J. Appl. Phys. 50 (6), Jun. 1979, pp. 4371–4377.
"Proximity effect correction for electron beam Lithography by equalization of background dose" by Geraint Owen and Paul Rissman, J. App. Physics 54 (6), Jun. 1983, pp. 3573–3581.

*Primary Examiner*—Charles L. Bowers, Jr.
*Assistant Examiner*—Martin J. Angebranndt
*Attorney, Agent, or Firm*—John H. Kusmiss; Thomas H. Jones; Guy M. Miller

[57] ABSTRACT

A method for producing a phase hologram using e-beam lithography provides n-ary levels of phase and amplitude by first producing an amplitude hologram on a transparent substrate by e-beam exposure of a resist over a film of metal by exposing $n \leq m \times m$ spots of an array of spots for each pixel, where the spots are randomly selected in proportion to the amplitude assigned to each pixel, and then after developing and etching the metal film producing a phase hologram by e-beam lithography using a low contrast resist, such as PMMA, and n-ary levels of low doses less than approximately 200 $\mu C/cm^2$ and preferably in the range of 20–200 $\mu C/cm^2$, and aggressive development using pure acetone for an empirically determined time (about 6 sec.) controlled to within 1/10 sec. to produce partial development of each pixel in proportion to the n-ary level of dose assigned to it.

3 Claims, 5 Drawing Sheets

CONTINUOUS PHASE AND AMPLITUDE HOLOGRAPHIC ELEMENTS

ORIGIN OF THE INVENTION

The invention described herein was made in the performance of work under a NASA contract, and is subject to the provisions of Public Law 96-517 (35 USC 202) in which the contractor has elected not to retain title.

TECHNICAL FIELD

The invention relates to a method for creation of phase and amplitude holographic elements with n-ary levels of phase and amplitude where n is greater than 2 and preferably greater than 16, and more particularly to a method of using e-beam lithography for creating amplitude control masks and phase delay surface relief patterns in a layer of transparent resist material, in that order, on a transparent substrate.

BACKGROUND ART

By Huygen's principle, an arbitrary optical field is fully determined once the light amplitude and phase are known over the beam aperture. Let that aperture be illuminated from the rear by a laser beam of known phase and amplitude. By introducing a thin-film optical element that adjusts the phase (by its optical thickness) and amplitude (by its transmittance) at each point across the aperture, it is possible to construct a totally arbitrary optical beam. This means that a uniform, collimated laser beam can be redirected and refocused to simultaneously illuminate multiple targets with adjustable intensity, phase-coherent radiation. This is, of course, the basis for all holography.

For a given illumination scene, the phase retardation and transmittance of the required holographic optical element can be computer calculated. Lithographic methods for fabricating computer generated holograms have been developed, and several realizations have appeared. The most common have been "binary" phase elements in which only 0° and 180° phase shifts are employed, although quaternary and octonary optical phase elements have been used or proposed. However, only very simple patterns have been produced, and placement errors in the patterning have proven troublesome.

It would be desirable to fabricate complex, computer generated, n-ary optical phase elements and to fabricate such elements with n-ary level amplitude programmed into discrete pixel locations, where $n \geq 16$ but not necessarily the same for both amplitude and phase. Such an element could be produced using an electron beam lithography system 10 shown schematically in FIG. 1, such as a JEOL JBX-5DII, on a stage 12 controlled in orthogonal x and y directions by a stage controller 13 which receives digital x, y commands from a programmed control computer 14, such as a model PDP-11. The required control data is loaded from an off-line data preparation computer 15. An electron gun 16 is provided with the necessary restriction aperture, alignment coil, lens, blanking electrode and intensity control through a beam deflector 17. The e-beam deflector is provided with an alignment coil, astigmatism correction coil, aperture selector, scanners and lens.

The e-beam lithography system 10 relies primarily on the positioning of the stage 12 for exposing the resist 11 pixel by pixel in the pattern programmed into the computer 14 and secondarily on the beam deflector 17 for positioning the e-beam in increments less than one digital step of the controller 13. A laser measurement system (not shown) is used for precision measurement of the stage position at each step. That measurement is then employed by the control computer as the precision feedback necessary for exposure of the resist 11. The entire electron beam lithography system 10 is contained within an enclosure 18, and a constant vacuum is maintained within the enclosure by means not shown. The entire system is conventional. What is new is the method in which the resist is exposed pixel by pixel in n-ary levels with low doses and then partially developed to produce from the exposed and developed resist a hologram having n-ary phase delay of light transmitted through its exposed face. Such an electron beam holographic system may also be fabricated to provide both n-ary phase and n-ary amplitude holographic elements by providing a suitable mask applied to the unexposed face of the resist 11 in a novel manner.

For phase delay, the amount of exposure of the resist could be varied from pixel to pixel in accord with a calculated pattern. The resist thickness remaining after development would then determine the optical phase delay for each pixel. However, commercially available resists are optimized for high sensitivity, high contrast, and high resolution. For the n-ary optical phase, the resist should have low contrast, as will be noted more fully below, while for producing a mask for n-ary amplitude control of the phased delayed light, a separate resist used may have high contrast. As will be shown, both resists may be of the same type.

The JEOL electron beam lithography system is optimally used for exposing large areas, each at a fixed dose, but it may also be used to alter the exposure from pixel to pixel. To accomplish that, twelve bytes of information are needed for each pixel. Preparing and processing these multimegabyte information files can be expedited by writing a code to translate the pattern data directly into "scanner" format, bypassing several data conversion steps normally encountered using the JEOL system in a conventional manner. Writing a scanner code also enables the user to control the stage motion and eliminate positional errors caused by the direction of stage travel. The scanner coding may thus facilitate use of the JEOL system for n-ary (grey level) control in the fabrication of phase holograms (where $n \geq 16$) of a size $\geq 1$ cm square with an array of pixels, each pixel $\leq 3$ μm square, and placement accuracy better than ±50 nm for $3\sigma$ (where $\sigma$ is a standard deviation) and accuracy of ±3%FS (full scale of maximum thickness) for $3\sigma$.

Phase holograms thus produced may have numerous uses. They may, of course, replace the binary, quaternary and octonary optical phase elements now in use, or being proposed, with improved efficiency and greater capability. Such elements are used in a variety of image processing and pattern recognition applications. They are also used for both laser beam combining and beam splitting. In addition, the technology has direct application in integrated optics. For example, such elements may be used in various image processing and pattern recognition applications, as well as depth profiling an optical waveguide and optical beam steering, coupling or focusing.

Surface contouring an e-beam resist by controlling both the exposure dose and the development process has been demonstrated by H. Fujita, et al., Opt. Lett. Vol. 6, page 613 (1981); Vol. 7, page 578 (1982). They designed, fabricated and tested micro Fresnel-zone plates, blazed gratings and Fresnel lenses using as a resist polymethyl methacrylate (PMMA), normally a very high contrast material commonly known by the trademark Lucite. The exposure method used involved scanning the e-beam in either straight lines or circles with the dose adjusted to give the desired surface depth after development. This method produced somewhat irregular groove shapes, but efficiencies of 50%–60% were achieved with near-diffraction limited performance.

More recently M. Ekberg, et al., reported on kinoform (digitized) phase holograms in Opt. Lett., Vol. 15, pp. 568–569 (1990). These were patterns comprising a 512×512 array of 10 $\mu$m square pixels, each with a unique high dose of an e-beam calculated to give the appropriate etch depth upon development. However, only ten levels of doses for levels of depth 20 nm level were used, and diffraction efficiencies of only 70% were reported.

High gamma (contrast) is a desirable property for photo- and e-beam resists used for device patterning. With high gamma, large variations in exposure dose will have little effect on the pattern shapes as long as the exposure is above a critical level. Hence, in the prior art, including that of Ekberg, et al., common resists and their development processes have been tailored in this direction of high contrast. However, high contrast does not allow for such precise definition of surface relief patterns as may be required in, for example, phase holograms with diffraction efficiencies significantly greater than 70%, which require greater precision in the etching of levels during development, particularly in levels much greater than 2 or even 10, such as 16 to 64 levels.

STATEMENT OF THE INVENTION

An objective of this invention is to provide complex computer generated surface relief patterns of n-ary levels (where n is greater than 2 and particularly where $n \geq 16$) in a layer of PMMA for various purposes, including phase holograms, with greater precision than is available using conventional e-beam lithography systems. Such precise patterns are often required, such as in holograms, comprising up to 3001×3001 arrays of pixels in the range of 0.3 to 2.0 $\mu$m that encode multilevel phase holograms.

A further objective is to provide such a complex computer generated phase hologram with proximity effect correction in the e-beam dose for each pixel, where the term "proximity effect" is defined as electron backscatter from a substrate for the resist material.

Yet another objective of the invention is to provide such a complex computer generated phase hologram registered with a complex computer generated n-ary amplitude hologram. The n-ary level of the amplitude hologram need not be equal to that of the phase hologram, and in practice may be as high as 100.

In accordance with the present invention, complex surface relief patterns, such as computer generated phase holograms (CGPH's), can be fabricated in a layer of low contrast resist material on a transparent substrate, such as PMMA on a substrate of glass, by low dose n-ary e-beam exposure and subsequent partial development. The CGPH pattern of n-ary phase delay pixels is encoded as a sequence of n-ary dose exposure pixels (preferably $n \geq 16$) and written on a layer of resist deposited on a transparent plate by a low-level e-beam less than approximately 200 micro Coulombs per centimeter square, and preferably in the range of 20 to 200 $\mu$C/cm$^2$ of a conventional lithography system using a different n-ary dose assigned to each pixel followed by partial timed development. The resulting pattern that appears rendered in relief in the resist then acts as a phase hologram for a coherent light beam passing through it and the transparent plate. Aggressive development of the exposed array of pixels in pure acetone at approximately 20° C. is precisely timed to provide low contrast, preferably near unity contrast. "Unity contrast" is defined as linear development as a function of dose for a measured time (e.g., six seconds) in pure acetone over the dose range of interest, and "low contrast" is defined as a small deviation from that unity contrast over the dose range of interest. This enables each pixel depth control to better than $\pm \lambda_{vis}/40$, where $\lambda$ is in the visible and near visible range.

For complex CGPH's with pixel size of the order of the e-beam proximity effect radius, the patterns are corrected for the extra exposure caused by electrons backscattered from the substrate. This correction is accomplished by deconvolving the two-dimensional dose deposition function with the desired dose pattern. To accomplish that, the deposition function is carefully measured under the exact conditions used to expose the resist, preferably with n-ary phase steps per 0.3 to 2.0 $\mu$m square pixel with equal phase steps. A Fresnel phase lens, having diffraction limited optical performance with better than 88% efficiency, has been fabricated using this technique with n=64.

An amplitude hologram of comparable complexity per pixel may be provided for the phase hologram by first depositing a film of metal on the transparent substrate. A film of e-beam resist material is deposited on the metal film and then exposed by computer controlled e-beam lithography to produce an amplitude hologram mask with n-ary level intensity programmed by dividing each pixel area into a matrix of m×m=n points and encoding a number $k \leq n$ of randomly selected points to receive a fixed maximum dose. Once the resist film is exposed, it is fully developed such that at each of k points of a pixel is binary encoded. The binary encoded mask of resist thus produced is then used to fully etch the metal. The encoded resist mask is then stripped, and a layer of resist is coated over the etched metal on the glass substrate in preparation for fabricating an n-ary phase delay encoded array of pixels precisely registered over the n-ary amplitude encoded array of pixels produced in the metal film. To facilitate registration, suitable registration marks may be provided in a conventional manner, such as by exposing corner marks in the resist used for providing the mask for etching the metal film.

DETAILED DESCRIPTION OF THE INVENTION

In the present invention, complex surface relief patterns are achieved for n-ary phase gratings for such use as in a phase and amplitude hologram with variations in depth controlled to better than $\pm\lambda_{vis}/40$ with low and preferably unity contrast. The developability of the resist would, ideally, be linearly related to the exposure dose. The early work reported by Fujita, supra, employed PMMA as the resist with development temperature controlled at 10° C., leading to very high contrast so that small changes in exposure led to large changes in developability and therefore etch depth. This certainly contributed to roughness observed in the etch profiles. Development of the present invention began with a search for an appropriate e-beam resist process having a low or near unity contrast, where unity contrast is defined to be the linear development as a function of dose for a fixed time over a dose range of interest.

The first system tried was an experimental acid hardening positive resist tailored to have low contrast. Initial experimentation revealed that after partial development, the remaining material was highly inhomogeneous, leading to unacceptable optical scattering. Since earlier work with PMMA had revealed no such problem (partial development simply removed a uniform layer of surface material), further experimental work progressed with PMMA. However, it should be understood that any other low-contrast, e-beam resist material may be used that does not produce inhomogeneous material as a result of partial development.

As noted hereinbefore, PMMA is normally a very high contrast material. However, in accordance with the present invention, contrast is controlled by the development process. That is accomplished by aggressive development of under exposed resist for a decreased contrast. In a series of tests, it was found that by developing under exposed PMMA resist using a low dose under 200 $\mu C/cm^2$ in pure acetone (the usual solvent for PMMA), contrast could be markedly reduced. This then led to the technique of low dose exposure and partial development as a method for n-ary level control for holographic optical elements. Development time decreased drastically to roughly five or six seconds with the actual time being determined empirically and controlled to $\pm 0.1$ second.

Figure 1:
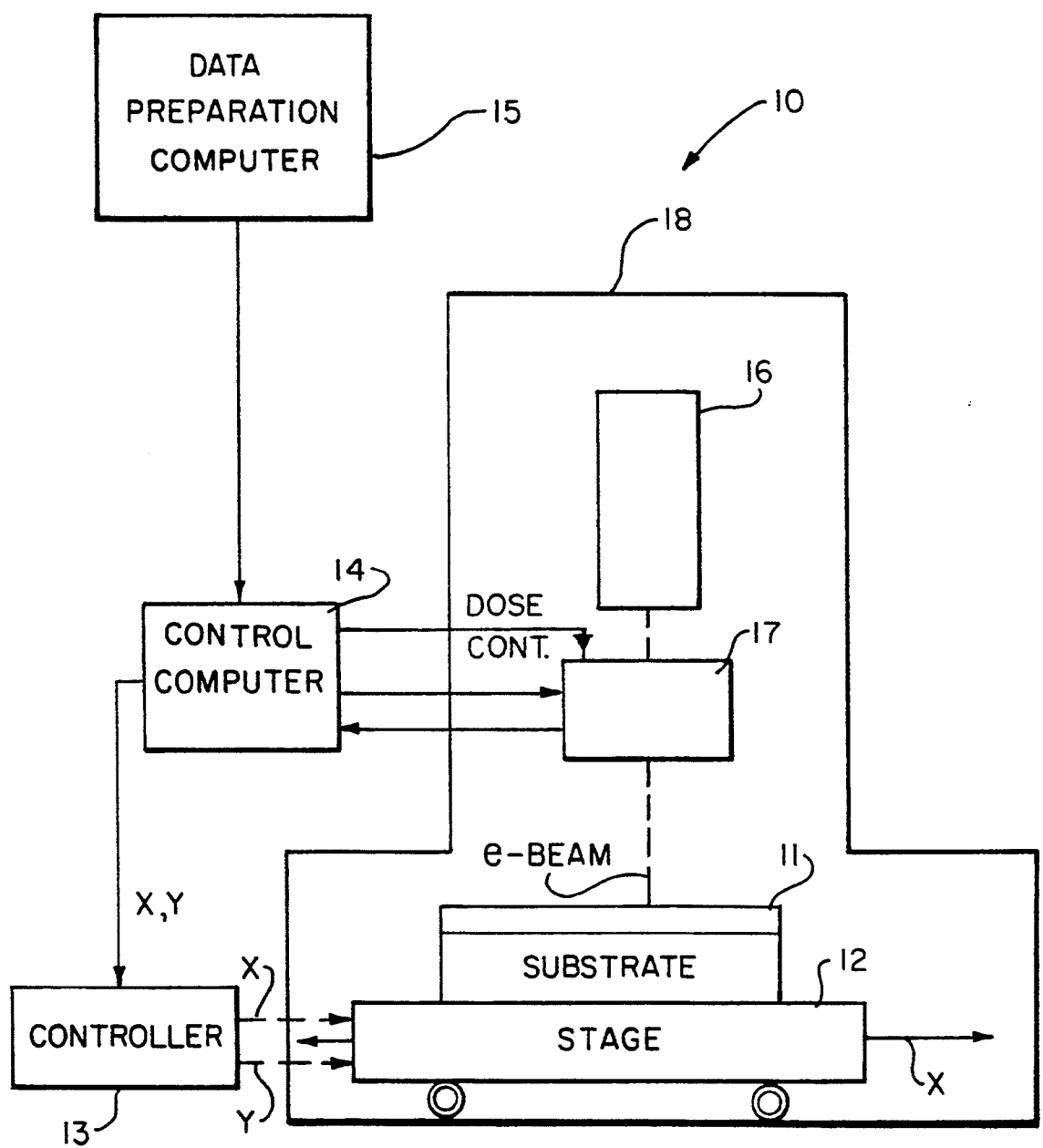
FIG. 1 is a schematic diagram of a conventional prior-art e-beam photolithographic system.
Figure 2:
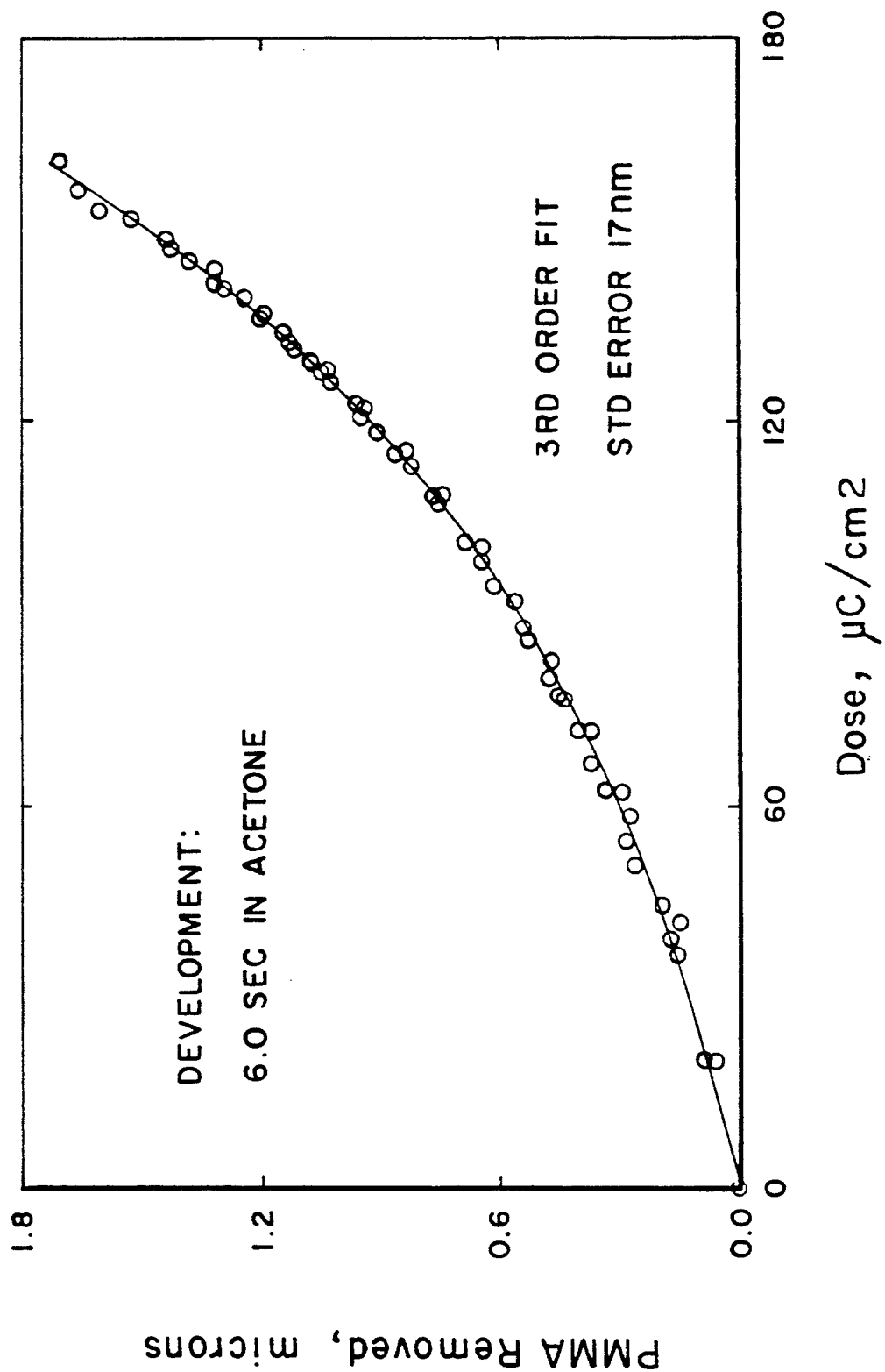
FIG. 2 is a graph of exposure dose sensitivity using pure acetone as the developer at 21° C.

This new technique of partial development of n-ary low level e-beam exposure of an array of pixels was accomplished using a Solitec resist spinner equipped with a Tridak resist dispense head. The molecular weight of the PMMA was in the range of 50,000 to 950,000 using a 5% solution in chlorobenzene and multiple layers were deposited (four for the actual molecular weight utilized) until a layer 2 $\mu m$ thick was formed in order to have a maximum edge depth of 1.29 $\mu m$ using n-ary exposure in accordance with the present invention. After exposure, acetone was introduced onto a spinning sample (500-3000 rpm) through the Tridak head for durations controlled by a computer to tenths of a second. The development process was then instantaneously terminated by a powerful blast of nitrogen gas, again controlled by the computer. A series of shorter and shorter development steps was used to achieve precise etch depths. This empirical determination of development time thus avoided the need for careful temperature control in the development process. FIG. 2 illustrates typical exposure versus development data for PMMA exposure dose sensitivity using pure acetone as the developer at approximately 21° C. Use of acetone for this resist material results in what is termed aggressive development, but it is used in the present invention for only partial development of pixels exposed with a low dose e-beam less than approximately 200 $\mu C/cm^2$ and preferably more than approximately 20 $\mu mC/cm^2$ in order to achieve n-ary phase holograms. Thus, by partially developing low-dose exposed PMMA in pure acetone, and with development time (controlled to $\pm 0.1$ sec) decreased drastically to roughly 5-10 seconds, contrast is markedly reduced. As noted above, the actual development time is determined empirically once other parameters have been established, such as the number of levels used (e.g., n=16 or n=64) and the range of the dose (e.g., 20 to 200 $\mu C/cm^2$) for ambient temperature of the system so that temperature need not be controlled. It is sufficient that temperature be reasonably stable over the period from empirically determining time and the development of the exposed resist for the devices being fabricated.

The principle method used to measure film thickness was channel fringe spectroscopy, wherein the interference fringes produced by light reflected from the PMMA top surface and from the substrate surface are spectroscopically measured and analyzed. This may be accomplished using the Leitz MPV-SP instrument. The data of FIG. 3 were fit by a third-order polynomial with a standard error of $\pm 17$ nm. This is equivalent to an optical phase shift, relative to air, of $\pm\lambda/75$. That analytic data was used to compute the dosage necessary to produce a desired etch depth with a precisely controlled development time of 6.0 seconds in pure acetone. Further tests revealed that, within experimental error, etch depth was linearly related to development time. Therefore, development time is an important control variable that needs to be determined empirically before setting the n-ary dose levels to be used for the desired grating or phase delay hologram.

The proximity effect, defined as exposure dose contributed by scattered electrons, plays a very important role. Much study has been given to that effect in the literature. It is found that typically 30% of the exposure dose at the center of a large uniformly exposed field can arise from electrons backscattered from the substrate. For present purposes, the spatial distribution of this proximity effect dose can be modeled as a Gaussian of the form $$D_p(\vec{r})/Q_o = \frac{\eta}{\pi a^2} \exp(-\vec{r}^2/a^2), \qquad (1)$$

where $D_p$, which depends strongly on substrate composition and geometry and upon the electron beam voltage, is the proximity dose intensity at distance r from a primary point dose $Q_o$ delivered at r=0, $\eta$ is the proximity factor, and $\alpha$ (typically 2-5 $\mu m$) is the range of the Gaussian. The total dose arriving at the distance r due to a spatially varying (patterned) primary dose $D_{prim}$, can be expressed as a convolution of an effective point spread function (PSF) with that patterned dose, as:

$$D_{tot}(\vec{r}) = \int\int d(\vec{r} - \vec{r_0}) \times D_{prim}(\vec{r_0}) \times PSF(\vec{r} - \vec{r_0}) \quad (2)$$
$$= D(\vec{r}) \otimes PSF(\vec{r})$$

where $$PSF(\vec{r}) = \delta(\vec{r}) + \frac{\eta}{\pi\alpha^2} \exp(-\vec{r}^2/\alpha^2) \quad (3)$$

Both $\eta$ and $\alpha$ depend strongly on substrate composition and geometry and upon the electron beam voltage. $\alpha$ is typically 2 to 5 $\mu$m. In the present invention, the absolute resist thickness is to be controlled to better than 60 nm and the relative thickness from pixel to pixel to better than 20 nm. This requires dose control at the percent level. Clearly, proximity effects must be taken into account.

In earlier work, fabrication of Fresnel lens treated the proximity dose problem only approximately. That lens displayed groove shapes that had rounded off tops and filled in trenches. It was first suspected that the development procedure caused the problem. A series of experiments employing significantly different techniques showed that development was not causing the problem. The proximity effect can also cause such distortion in the groove shapes. At zone boundaries, excess proximity dose from the heavily exposed valley regions overlaps into the lightly dosed areas, and vice-versa. In later work, the proximity effect was carefully measured, and corrections for it applied to the pattern in accordance with Equations (2) and (3).

Figure 3:
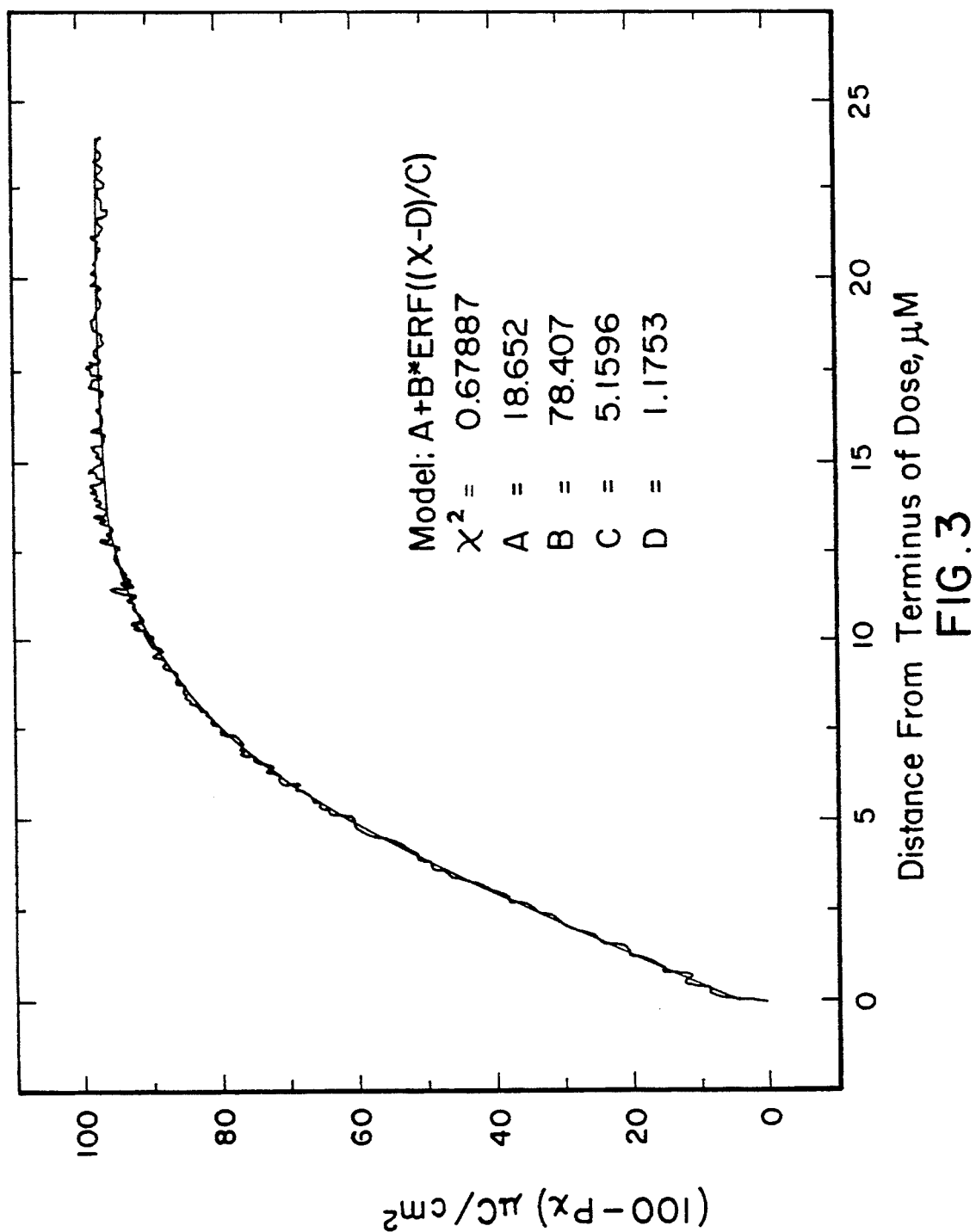
FIG. 3 is a graph of a fit of the experimentally measured proximity effect (dose) at the edge of a heavily exposed half-plane to the complementary error function plotted as a fixed dose (100 $\mu$C/cm$^2$) minus the proximity effect (Px) as a function of distance from the terminus of the dose spot.

Once the e-beam dose sensitivity of PMMA is calibrated (FIG. 2), direct measurement of proximity parameters becomes possible. A square area many times larger than the range, $\alpha$, of the effect is first exposed with a measured, heavy dose. After controlled development, the PMMA at the perimeter of the area is seen to be thinned in a characteristic way by the proximity dose. Integrating the above Equation (2) for geometry leads to the following equation for the decay of the proximity dose with distance from the edge of the exposed area:

$$D_{prox}(x) = \frac{\eta}{2} D_{prim}[erfc(x/\alpha)] \quad (4)$$

where erfc(x) is the complimentary error function. FIG. 3 shows a fit of such data using the parameters $\alpha = 5.25$ microns and $\eta = 0.25$.

An exact solution for the proximity effect is possible in the present situation, which is not usually the case. In the usual binary e-beam lithography, the resist is to be either fully developed or totally undeveloped. Since at the boundary of exposed areas, the proximity effect will always lead to exposure of the adjacent region and negative dose is not possible, no exact solution for proximity effect correction is achievable. In the present invention, every point in the pattern receives a finite primary dose that can be corrected by increasing or decreasing the dose. The primary dose might even include a bias value introduced to allow for a negative correction. Thus, the primary doses can be adjusted both up and down to account for the proximity effect of dose delivered from surrounding pixels.

Several mathematical schemes are available to compute this correction. Deconvolution by Fourier transform represents a straightforward approach. If P(r) is the desired exposure pattern and P(k) its Fourier transform, and PSF(r) is the point spread function and PSF(k) its Fourier transform, then Pc(k), the Fourier transform of the desired function is:

$$Pc(k) = P(k)/PSF(k). \quad (5)$$

The corrected dose pattern Pc(r) is then obtained by inverse transforming Pc(k). Indeed, it was found necessary to recess typical patterns by approximately 0.2 microns with a bias dose to eliminate negative proximity effect correction doses. A carefully optimized two dimensional fast Fourier transform deconvolution program has been implemented on a VAX Station 3100 computer. It handles a 4K by 4K problem in five hours.

Consideration of the isotropic nature of the development (etching process) being used reveals that the risers separating adjacent lands etched to near-identical depths will be sloped at 45°. Further, a shallow land adjacent to a very deep one will be etched laterally by an amount equal to its depth. Worse, a land half as deep as its neighbor will be etched laterally by half its depth. Noting that a transmission phase plate for use at the wavelength of the red helium neon laser must have groove depths of $\lambda/(n-1) = 1.29$ microns, it becomes apparent that the pixel size of kinoform-encoded CGPHs must be larger than about one micron to avoid serious degradation at the hands of isotropic etching. Note that for patterns resembling uniform, curved gratings, as do those for simple lenses, the case of half-height risers, which leads to maximum lateral etching, does not arise as long as there are many pixels in the narrowest Fresnel zone.

The pattern data format for the JEOL JBX-5DII e-beam lithography system requires sixteen bytes to specify a single elementary pattern unit and currently cannot handle files longer than 512MB. Thus, a kinoform-encoded CGPH can be no larger than 5K by 5K. To uniformly expose a 1 micron square pixel, an e-beam spot size of approximately 0.2 micron diameter should be used, and it should increment between exposure doses by less than about 0.1 microns. The JBX-5DII also has a maximum shutter speed of 0.5 microseconds. Since an area 0.1×0.1 microns square is exposed at each click and a minimum dose of 20 $\mu$/C/cm$^2$ is expected, the beam current must be limited to less than 3 na. Under these exposure conditions, a pattern over one square cm can be exposed in approximately 15 hours.

Based upon the above considerations, an exposure pattern for an off-axis Fresnel lens 3 mm square with 3751×3751 square pixels each 0.8 micron on a side, having a focal length of 38 mm, and with its center of curvature 2 mm from the lens center, was prepared. First, the requisite phase delay was calculated as a floating point number for each pixel in a 4K by 4K array. These numbers were converted first to equivalent PMMA thickness to be removed and then to total electron dose, this based upon calibration data like that shown in FIG. 2. Next, the Fourier deconvolution procedure was applied. The corrected dose pattern was then cropped to its central 3751 rows and columns eliminating wrap-around errors introduced by the FFT technique. A histogram of all the doses was assembled and divided into 64 bins, equal numbers of pixels in each bin. This data set was then encoded in the format used by the JEOL JBX-5DII. An algorithm was used that grouped adjacent pixels with identical exposure into larger rectangular patterns, thus achieving modest data compression. In place on the PDP 11/84 that controls the JBX-5DII, this data set was some 125MB long. Individual 3 mm square Fresnel lenses require 90 minutes to expose. Development time in pure acetone was 11 seconds.

This and like lenses have been fabricated and fully characterized both physically and optically. They were etched in 2 micron thick PMMA films on 1/10 wave borosilicate crown (BK7) glass optical flats. The PMMA was built up by 4 applications of 950K molecular weight polymer in 5% solution in chlorobenzene spun at 3000 rpm. Thorough baking (170° C., 60min.) between applications produced a uniform film with no evidence of vertical inhomogeneity in the final results. A 100 Å layer of aluminum was applied over the PMMA prior to exposure to dissipate charge. This was stripped in mild alkali prior to development which proceeded as described above.

A knife-edge test was performed to access the optical performance of the JPL-designed Fresnel lens. An expanded, collimated helium neon laser beam was focused by the lens, and a razor-blade knife edge was mechanically driven across the focal point in the focal plane. Energy passing the knife edge was monitored by a photodiode detector. It was found that 88% of the incident light energy was focused (first diffraction order), <2% was redirected into high focusing order, <1% was diffracted by the "pixel grating," 1.6% passed through the lens undeviated (zeroth order) and about 10% of the incident radiation was scattered diffusely. An attempt was made to adjust the final etch depth to minimize the zeroth order energy. The data points fit the predicted curve within experimental limits. This result might be anticipated on the basis that the patterning precision of JEOL JBX-5DII lithography system, ±50 nm, is essentially perfect on the scale of the Fresnel zone pitch and diameter.

In the present invention, it is important to control the absolute resist thickness to better than 60 nm and the relative thickness from pixel to pixel to better than 20 nm. This requires dose control at the percent level. Clearly, proximity effects must be taken into account, but may be approximated in accordance with Equation (1) with only some degradation of physical characterization of the Fresnel lens. For an approximation, it is assumed that all pattern variations average out over the proximity range. This means that at each pixel, the proximity dose would be the same and equal to that caused by the average primary dose. For a Fresnel lens pattern used as an example in the development of the invention, this approximation fails near the center (in the first few Fresnel zones) where the etch depth changes only slowly with distance. However, it is not a good approximation at all when the pixel size itself approaches the proximity range. Effects due to this error are clearly visible in the results and probably account for much of the loss in optical efficiency observed in testing the Fresnel lens. However, efficiency was nevertheless improved to 85%, which is 70% greater than had been achieved before this invention.

Examples of Fresnel lens patterns with approximation or proximity effect correction Two sets of patterns were fabricated. The first set comprised four patterns designed by F. Coetzee and D. Casasent at the Center for Excellence for Optical Data Processing, Carnegie Mellon University. These described two astigmatic Fresnel lenses using up to 6000×1861 pixels 0.3 $\mu$m square, a linear array of 17 cylindrical lenses with 1000×4250 1.0 $\mu\mu$ square pixels (all for refocusing the output beams of near-IR solid-state diode lasers), and an array of superimposed cylindrical lenses, each with a different orientation and linear phase term with 4000×4000 2.0 $\mu$m square pixels (to perform an optical Hough transform). The data was in the form of pixel by pixel phase delay rounded to the nearest 1/16th of a wavelength with error diffusion. Code was written to process this information directly into the "J51" format needed to drive the pattern generator of the JEOL JBX-5DII e-beam lithography system. The code grouped adjacent pixels having the same phase delay into single patterns. This afforded significant data compression, particularly for the cylindrical lenses. The code also resized each pattern to eliminate overlap at boundaries. The first three patterns were exposed, developed and physically characterized, but no data is available on their optical performance.

A Fresnel phase lens was then designed at the Jet Propulsion Laboratory for use at the wavelength of the helium neon laser where it could be tested. To achieve a 360° phase shift in PMMA relative to air requires a thickness of $\lambda/(n-1)=1.29$ $\mu$m. Pixels at the Fresnel-zone boundaries differed in etch depth by that amount. Away from the boundaries, the differences in thickness of adjacent phase delay zones were 1/16 of that, or 0.08 $\mu$m. Due to the isotropic nature of the development process, as a step is exposed, its lower riser will begin to etch laterally at the same rate that the step land etches down. This implies that the risers will always be tilted back at an angle whose tangent is given by the ratio of the etch rates of the adjacent steps. For the two deepest steps, the ratio approaches one, and the riser angle approaches 45°.

At the Fresnel-zone boundaries, the step edge will recede laterally at the same rate that it descends. For the base dose chosen, 20 $\mu$C/cm$^2$, that amount at full development was approximately 0.1 $\mu$m. These sidewall etching effects cannot be avoided, but their influence on the optical performance can be minimized by adjusting the pixel shapes in the data pattern, although this was not attempted. To minimize their importance, a 1.0 $\mu$m pixel size was chosen. Data set size and exposure time constraints dictated total pattern area. A square 3001×3001 array was chosen. The requirement of 16 phase levels in the outermost full circle zone determined the design focal length 38 mm. Data was processed as described above yielding an exposure file 51 Mb long. Total data processing time was one hour, and the e-beam exposure time was 90 minutes. This lens has been fabricated and fully characterized both physically and optically.

Fabrication details of above examples

The JPL-designed Fresnel Lens described above was exposed using the JEOL JBX-5DII e-beam lithography system at the Center for Space Microelectronics Technology Microdevices Laboratory. A beam current of 3.0 na, beam waist diameter approximately 0.3 $\mu$m, and step size of 0.2 $\mu$m were used. The minimum dose was set at 20 $\mu$C/cm$^2$. Less than this produced so little solubility increase that unexposed PMMA was removed too rapidly during development. At the chosen dose, the dissolution rate ratio of unexposed to minimally exposed PMMA was an acceptable 4:1. The shot time for these conditions was 2.7 $\mu$s. Shot time for the JEOL JBX-5DII is quantized in increments of 50 ns. This, together with the nonlinearity of the dose-response curve for PMMA, sets a limit on the upper dose that can be used, the difference in exposure time needed to produce a 1/16 wavelength phase step decreases, ultimately approaching the quantization limit. For the stated conditions, the difference in shot time between the most deeply etched phase steps was 13 clock ticks enabling the step size to be set within 8%. The doses needed to produce 16 equally spaced etch depths were determined using data like that shown in FIG. 2. The approximation was made that the proximity dose at each step would be the same and equal to that produced by the median primary dose. As noted above, this approximation is inadequate for the central Fresnel zones.

The substrates (transparent plates) were ⅛ inch thick, 1 inch diameter 1/10 wave optical flats of BK7 glass. These were first prepared with gold fiducial marks so that the e-beam could be focused and its deflection factors calibrated directly at the exposure plane. A 2 $\mu$m thick layer of PMMA was built up on the surface by 4 applications of 950K molecular weight polymer in 5% solution in chlorobenzene spun at 3000 rpm. Thorough baking (170° C., 60 min) between applications produced a uniform film—there was no evidence of vertical inhomogeneity in the final results. A 100Å layer of aluminum was applied over the PMMA prior to exposure to dissipate charge. This was stripped in mild alkali prior to development which proceeded as described above. Additionally, sixteen 50×50 $\mu$m test patches were exposed with doses calculated to give equally spaced etch depths, that could be used to monitor the progress of the development. To facilitate that measurement, the test patches were exposed over a region of the substrate that was coated with 200Å of aluminum prior to spinning on the resist film. Without the aluminum, the channel fringes used to measure the film thickness had near-zero visibility because the refractive indices of PMMA glass are nearly equal (1.49 versus 1.54).

Physical characterization

Figure 4:
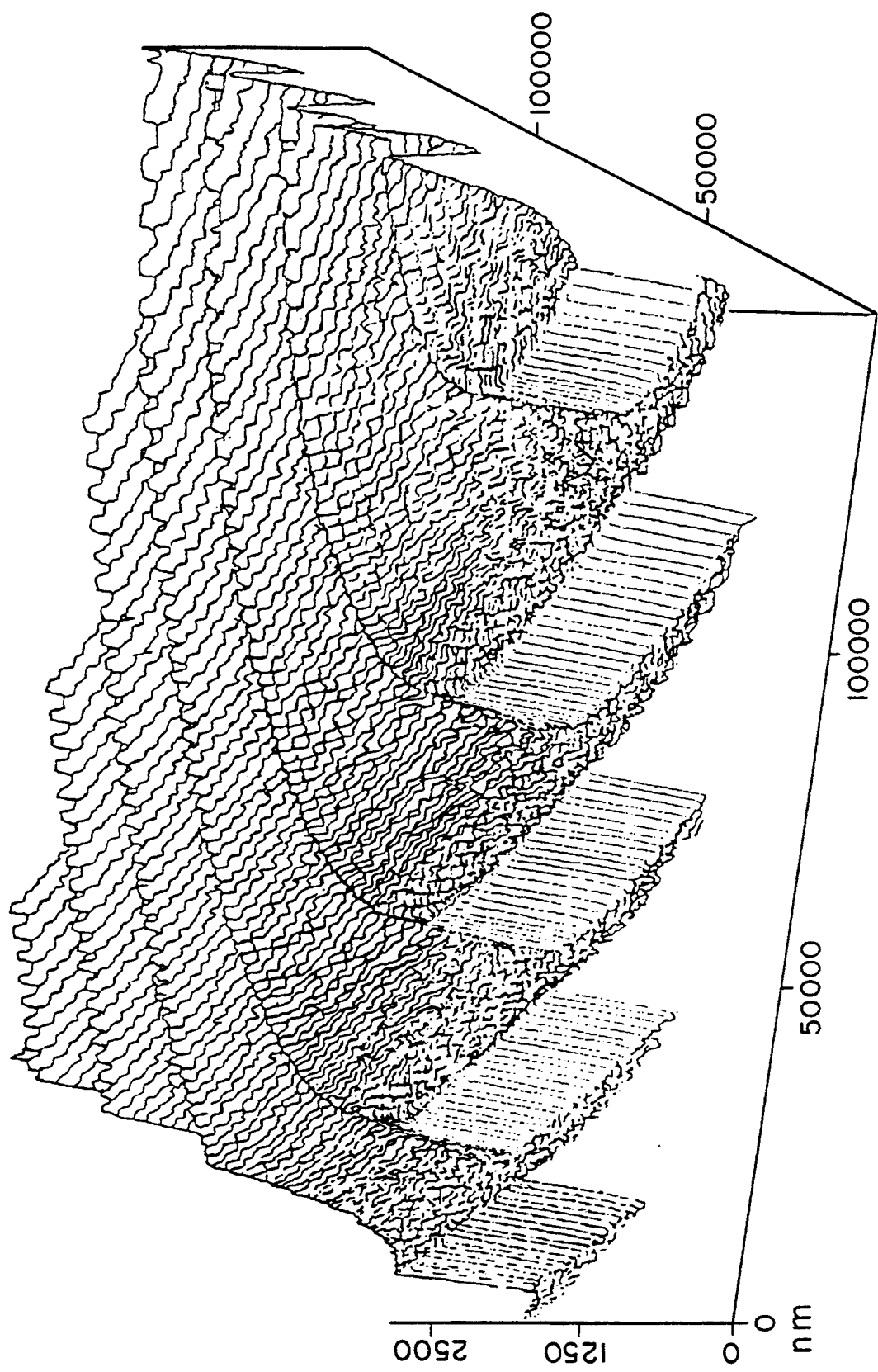
FIG. 4 is a three-dimensional plot of an area near the center of an astigmatic Fresnel lens fabricated in accordance with the present invention with n=16 and measured by a scanning atomic force microscope (AFM).

FIG. 4 is a three-dimensional representation of an area near the center of one of the astigmatic Fresnel lenses, produced by a scanning Atomic Force microscope (Digital Instruments Nanoscope atomic force Microscope (AFM)). No evidence of field stitching or pattern overlap can be discerned. Even small errors of this sort produce dramatic effects as etch depth will be doubled in areas of pattern overlap. Individual phase steps can be seen. Note that the steepness of the vertical back walls is much enhanced in the figure because of the difference in vertical and horizontal scales. In fact, the steepness recorded by the AFM is limited by its tip geometry. The instrument used to acquire the data had a pyramidal cone with an apex angle of approximately 114°. Scanning electron microscopy (SEM) data and AFM data taken with ultra sharp tips, indicate that back wall steepness exceeded 60°.

High resolution AFM topographic data indicate that the surface roughness of the partially developed PMMA was of the order of ±5 nm. Quantitative AFM profile data reveal that in the central Fresnel zones, too much PMMA has been removed in the deeply etched regions and too little in the shallow regions. This failure is due to the use of only an approximate treatment of the proximity effect, which is corrected by the more precise proximity effect correction applied in accordance with Equations (2) and (3). Similar data, taken at the pattern edges where the Fresnel zones are narrower than the proximity range, show the desired linear ramp.

Physical examination of the JPL-designed Fresnel lens showed a similar result. Optical film thickness data was taken at the center of the pattern where the individual phase plateaus were broad enough to permit measurement with the Leitz MPV-SP instrument. Again, the effects of inadequately treating the proximity effect were apparent.

Optical characterization

Figure 5:
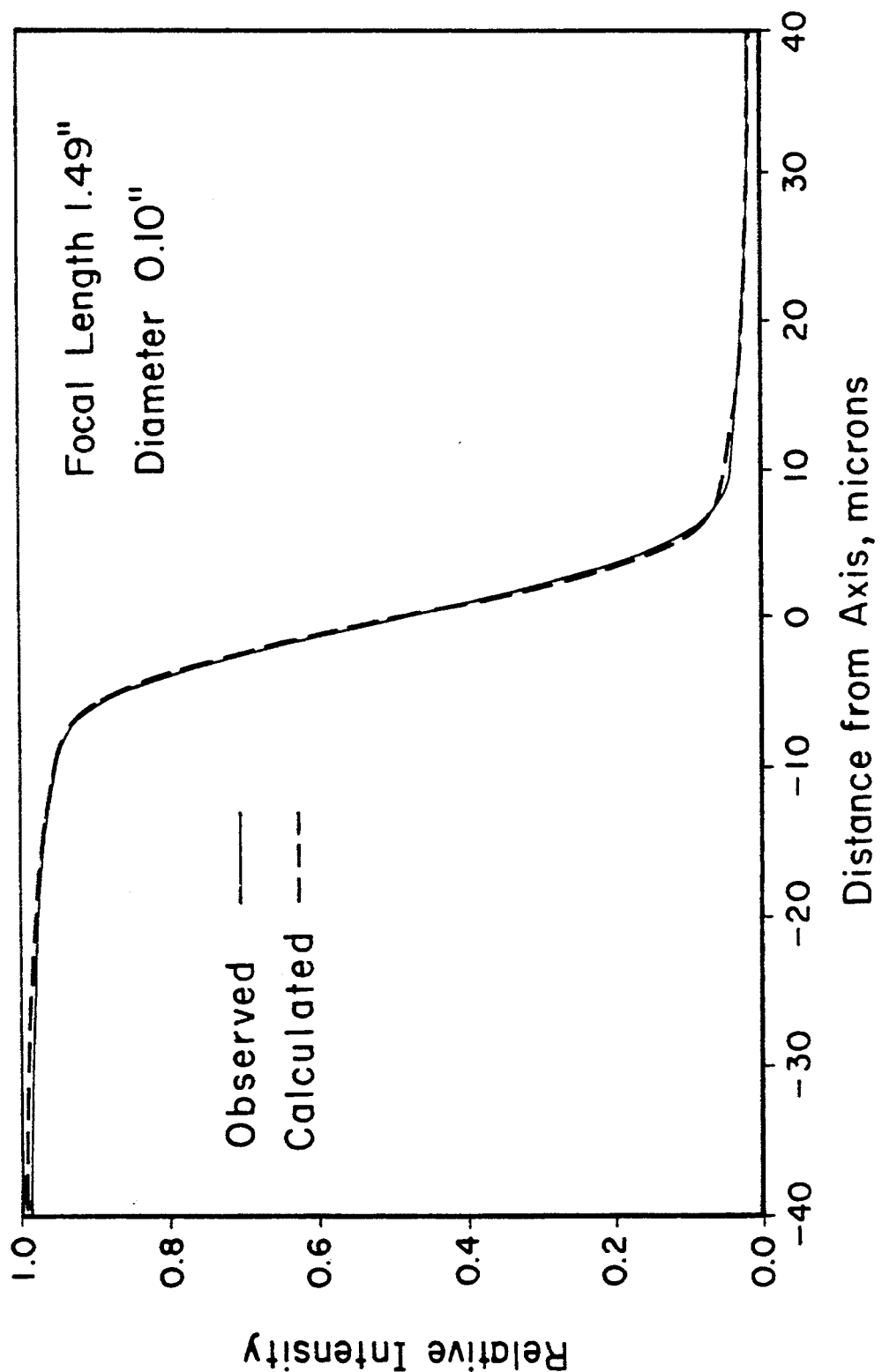
FIG. 5 is a graph of observed energy passed by a knife-edge scanned in the focal plane of a Fresnel phase lens made in accordance with the present invention.

A knife-edge test was performed to access the optical performance of the JPL-designed Fresnel phase zone lens. An expanded, collimated helium neon laser beam was focused by the lens, and a razor-blade knife edge was mechanically driven across the focal point in the focal plane. Energy passing the knife edge was monitored by a photodiode detector. It was found that 83% of the incident light energy was focused (first diffraction order), 14% was redirected into high diffraction orders and 3% passed through the lens undeviated (zeroth order). An attempt was made to adjust the final etch depth to minimize the zeroth order energy. FIG. 5 shows the intensity of the first-order radiation as a function of knife-edge position plotted together with a curve derived by integrating the Airy function that indicates diffraction limited performance. The data points fit the predicted curve within experimental limits. This result might be anticipated on the basis that the patterning precision of JEOL JBX-5DII lithography tool, ±50 nm, is essentially perfect on the scale of the Fresnel-zone pitch and diameter. The high-order radiation formed a set of concentric circles in the far field. This would be predicted for energy diffracted by an error in the phase step profile that repeated in each Fresnel zone. Its origin can therefore be tentatively ascribed to the known errors in profile introduced by our inadequate treatment of the proximity effect.

Amplitude hologram

An amplitude hologram may be produced on the substrate (transparent plate) for the phase hologram by first coating the optical flat face of the glass substrate with a metal film, and a film of e-beam resist and then exposing the resist for the pixel array desired with the n-ary amplitude programmed as desired for the phase hologram. To accomplish that, each pixel is divided into an m×m=n matrix where m is a fixed number, such as 10, for a total number n of 100 subpixels. Each pixel is then programmed at random for binary doses (zero or full) with the total number programmed for a full dose being selected for the level of amplitude desired in increments of one part in a hundred. Once the exposed resist is developed, the metal film is etched to produce an optical mask. The resist is then stripped so that the optical flat face of the glass substrate with the mask may be coated with a resist which is subsequently processed for the fabrication of a phase hologram registered over the mask. Registration marks, such as at the corners of the mask, are etched together with the etched openings for the n-ary amplitude hologram for use in registration of the e-beam exposures for fabrication of the phase hologram.

Although particular embodiments of the invention have been described and illustrated herein, it is recognized that modifications and variations may readily occur to those skilled in the art. Consequently, it is intended that the claims be interpreted to cover such modifications and equivalents.

We claim:

1. A method for creation of a phase hologram element with n-ary levels of phase delay assigned to pixel areas thereof, where the number of levels is greater than sixteen, using e-beam lithography for creating complex surface relief patterns in a layer of low contrast e-beam resist material on a transparent substrate, comprising the steps of exposing said pixel areas by a range of low doses of e-beam at n-ary levels in polymer resist material with individual dose correction for proximity effect, and partially developing said resist material by controlled time of development less than necessary for full development, resulting in partial removal of e-beam exposed resist material in pixel areas in proportion to said n-ary levels of e-beam doses, wherein exposures to said e-beam of adjacent pixels are each individually assigned a primary dose corrected for proximity effect, said proximity effect being defined as exposure dose contributed by backscattered electrons from said transparent substrate, said proximity effect being of the Gaussian form $$D_p(\vec{r})/Q_o = \frac{\eta}{\pi a^2} \exp(-\vec{r}^2/a^2),$$

where $D_p$, which depends strongly on substrate composition and geometry and upon the electron beam voltage, is the proximity dose intensity at distance r from a primary point dose $Q_o$ delivered at $r=0$, $\eta$ is the proximity factor, and $a$ is the range of the Gaussian, and said primary dose assigned to each of said adjacent pixels is corrected by having the total dose arriving at said distance r due to a spatially varying patterned primary dose $D_{prim}$, expressed as a convolution of an effective point spread function, PSF, with that patterned primary dose, as:

$$D_{tot}(\vec{r}) = \int\int d(\vec{r} - \vec{r_0}) \times D_{prim}(\vec{r_0}) \times PSF(\vec{r} - \vec{r_0})$$
$$= D(\vec{r}) \otimes PSF(\vec{r})$$

where $$PSF(\vec{r}) = \delta(\vec{r}) + \frac{\eta}{\pi a^2} \exp(-\vec{r}^2/a^2).$$

2. A method for creation of an amplitude hologram in registration with a phase hologram element having n-ary levels of phase delay assigned to pixel areas thereof, where the number of levels is greater than sixteen, said method for creation of an amplitude hologram comprising the steps of first depositing a thin film of metal on said transparent substrate, depositing a film of resist material over said thin film of metal on said transparent substrate, exposing with a fixed maximum dose a separately selected percentage of each pixel area of said amplitude hologram, thereby producing a binary exposed film of resist material, fully developing said binary exposed film of resist material, thereby producing an encoded resist mask, fully etching said thin film of metal through said encoded resist mask, stripping said encoded resist mask, thereby leaving an encoded pattern of fully etched thin film of metal, and depositing a layer of low contrast e-beam resist material over said encoded pattern fully etched thin film of metal, and then proceeding with creation of said phase hologram over said amplitude hologram using e-beam lithography for creating complex surface relief patterns in a layer of low contrast e-beam resist material on said transparent substrate, exposing said pixel areas of said phase delay hologram by a range of low doses of e-beam at n-ary levels in said e-beam resist material, and partially developing said e-beam resist material by controlled time of development less than necessary for full development, resulting in partial removal of e-beam exposed resist material in pixel areas in proportion to said n-ary levels of e-beam doses.

3. A method as defined in claim 2 wherein said separately selected percentage of each pixel area of said amplitude hologram is made up of a number k of randomly selected spots in an array of $m \times m = n$ spots, wherein said number k is equal to said separately selected percentage of said $m \times m = n$ spots.

* * * * *